(12) United States Patent
Cheng et al.

(10) Patent No.: US 11,928,397 B2
(45) Date of Patent: Mar. 12, 2024

(54) RELIABILITY-BASED TOPOLOGY OPTIMIZATION DESIGN METHOD FOR PART STRUCTURE CONSIDERING BOUNDED HYBRID UNCERTAINTIES

(71) Applicant: ZHEJIANG UNIVERSITY, Zhejiang (CN)

(72) Inventors: Jin Cheng, Hangzhou (CN); Deshang Peng, Hangzhou (CN); Zhenyu Liu, Hangzhou (CN); Daxin Liu, Hangzhou (CN); Jianrong Tan, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 18/338,319

(22) Filed: Jun. 20, 2023

(65) Prior Publication Data
US 2023/0342515 A1 Oct. 26, 2023

Related U.S. Application Data

(63) Continuation of application No. PCT/CN2021/079563, filed on Mar. 8, 2021.

(51) Int. Cl.
*G06F 30/17* (2020.01)
(52) U.S. Cl.
CPC .................................. *G06F 30/17* (2020.01)
(58) Field of Classification Search
CPC ........... G06F 30/00; G06F 30/17; G06F 30/20
(Continued)

(56) References Cited

U.S. PATENT DOCUMENTS

2021/0350036 A1* 11/2021 Burla ...................... G06F 30/20

FOREIGN PATENT DOCUMENTS

| CN | 203271767 U | * 11/2013 |
| CN | 106650147 A | 5/2017 |

(Continued)

OTHER PUBLICATIONS

Li et al., "Addictive Manufacturing-Driven Design Optimization: Building Direction and Structural Topology", Jun. 24, 2020, Addictive Manufacturing 36, Elsevier B.V. (Year: 2020).*

(Continued)

*Primary Examiner* — Cedric Johnson
(74) *Attorney, Agent, or Firm* — W&G Law Group

(57) ABSTRACT

A reliability-based topology optimization design method for a part structure considering bounded hybrid uncertainties, includes the following steps: considering the uncertainties in the manufacture and service of the part structure, describing an external load with insufficient samples and a material property with sufficient samples as an interval variable and a bounded probabilistic variable respectively; discretizing a design domain of the part structure, setting the physical and geometric constraints, and establishing a reliability-based topology optimization design model; solving by a moving asymptote algorithm: decoupling the probabilistic and interval uncertainties, and determining the worst working condition by using gradients of constraint performance functions; defining a performance fluctuation under the worst working condition and calculating reliability of constraint performance; and finally, calculating the gradients of objective and constraint functions with respect to the design variables for iteration.

1 Claim, 5 Drawing Sheets

(58) Field of Classification Search
USPC .................................................. 703/7, 2, 6
See application file for complete search history.

(56)              References Cited

FOREIGN PATENT DOCUMENTS

| CN | 107515963 | A |   | 12/2017 |            |
|----|-----------|---|---|---------|------------|
| CN | 108009381 | A |   | 5/2018  |            |
| CN | 209594700 | U | * | 11/2019 |            |
| CN | 110795836 | A |   | 2/2020  |            |
| CN | 111475976 | A |   | 7/2020  |            |
| WO | WO-2021040705 | A1 | * | 3/2021 | ............. G06F 30/10 |

OTHER PUBLICATIONS

International Search Report (PCT/CN2021/079563); dated Dec. 8, 2021.

* cited by examiner

US 11,928,397 B2

RELIABILITY-BASED TOPOLOGY OPTIMIZATION DESIGN METHOD FOR PART STRUCTURE CONSIDERING BOUNDED HYBRID UNCERTAINTIES

CROSS-REFERENCE TO RELATED APPLICATIONS

The present application is a continuation of International Application No. PCT/CN2021/079563, filed on Mar. 8, 2021, the content of which is incorporated herein by reference in its entirety.

TECHNICAL FIELD

The present disclosure belongs to the field of the optimization design of equipment structure, and relates to a reliability-based topology optimization design method for a part structure considering bounded hybrid uncertainties.

BACKGROUND

As a method of distributing finite materials in a design domain to optimize the structural objective performance, topology optimization has been widely applied in product design. Since there are various uncertainties in the processes of manufacture and use, in order to ensure that theoretical results obtained by topology optimization will not deteriorate in performance after actual manufacture, the impact of the uncertainties must be considered in the design stage. However, traditional reliability-based topology optimization method that uses only a single type of mathematical model to describe multi-source uncertainties may probably lead to the distortion of uncertainty modeling and the failure of the resulting optimal scheme of a product structure, so it is necessary to carry out the reliability-based topology optimization of a part structure simultaneously considering probabilistic and interval hybrid uncertainties.

In addition, in the field of reliability-based structural topology optimization considering hybrid uncertainties at present, most of researches still transform an original problem into an equivalent deterministic problem after searching the most probable point, which has obvious defects for an optimization problem involving multiple reliability-based constraints: the most probable points obtained from the analyses of different reliability-based constraints are often inconsistent, and their trade-offs either introduce subjective factors or involve additional calculations. In addition, the reliability expressions constructed by existing methods often requires additional condition discrimination, and the calculation result of reliability-based gradient in some scenarios can hardly apply to a gradient-based topology optimization framework. Therefore, on the basis of giving the description of bounded hybrid uncertainties, it is necessary to study a reliability-based topology optimization method involving multiple constraint performance functions, and improve the gradient analyticity of the reliability expressions of constraint performance.

SUMMARY

In order to solve the problem of reliability-based topology optimization design of a part structure under the influence of multi-source uncertainties, the present disclosure provides a reliability-based topology optimization design method for a part structure by considering bounded hybrid uncertainties. The method includes the following steps: considering the uncertainties in the manufacture and use of a part structure, describing an external load with insufficient samples as an interval uncertainty and a material property with sufficient samples as a bounded probabilistic uncertainty; discretizing a design domain, setting physical and geometric constraints, and establishing a reliability-based topology optimization design model of the part structure; iteratively solving by a moving asymptote algorithm: decoupling the probabilistic and interval uncertainties, and determining a worst working condition by the gradients of constraint performance functions; defining a performance fluctuation under the worst working condition and calculating the reliability of constraint performance; and finally, calculating the gradients of objective and constraint functions on design variables for iteration. The present disclosure efficiently solves the problem of the reliability-based topology optimization design of a part structure when probabilistic and interval uncertainty factors coexist, and is very valuable to engineering application.

The present disclosure is implemented through the following technical solution: a reliability-based topology optimization design method for a part structure by considering bounded hybrid uncertainties includes the following steps:

1) Considering following uncertainties in the manufacture and service processes of a part structure: regarding the amplitude and direction of an external load which are difficult to obtain sufficient sample information as interval uncertainties; and regarding a material property of the part structure with sufficient sample information as a bounded probabilistic uncertainty, and describing a bounded probabilistic uncertainty parameter as a random variable subject to generalized beta distribution.

2) Discretizing a design domain of the part structure, which is specifically as follows:

Simplifying a force condition of the part structure into a two-dimensional plane stress state, retaining installation holes and removing structural details to improve calculating efficiency; placing the simplified part structure in a regular rectangular design domain, and dividing the rectangular design domain into $N_x \times N_y$ square elements, where $N_x$ and $N_y$ are the numbers of divisions along x,y axes respectively; and based on a solid isotropic material with penalization (SIMP) topology optimization framework, imparting each element with a unique design variable $\rho_e \in [0,1]$ (e=1, 2, ..., $N_x \cdot N_y$).

3) Imposing physical constraints and geometric constraints on the discretized structure, which is specifically as follows:

3.1) Imposing the physical constraints including fixing or supporting and an external load according to a classical finite element method.

3.2) Imposing the geometric constraints including specified holes in the structure and areas where materials are forcibly retained.

A method is to set design variables corresponding to elements in the holes as $\rho_e=0$ and set design variables corresponding to elements in the area where the materials are to be retained as $\rho_e=1$, and values thereof are kept unchanged in subsequent optimization process.

4) By taking a space utilization rate of the design domain as an objective function and taking the displacements of several key points of the part structure considering a joint influence of interval and bounded probabilistic hybrid uncertainties as reliability constraint performance, establishing a reliability-based topology optimization design model for the part structure, as shown in Eq.1:

$$\min_{\rho} V(\rho) = \sum_{e=1}^{N_e} \rho_e / V_0 \qquad \text{Eq.1}$$

$$s.t. g_q(\rho, X, I) = -P(u_q(\rho, X, I) \leq u_{qcri}) + P_q \leq 0 (q = 1, 2, \cdots, N_{con})$$

$$K(\rho, X)U = F(I)$$

$$0 \leq \rho_{min} \leq \rho_e \leq 1 (e = 1, 2, \cdots, N_e)$$

$$X = (X_1, X_2, \cdots, X_m)^T, I = (f_1, f_2, \cdots, f_n, \alpha_1, \alpha_2, \cdots, \alpha_n)^T$$

where in Eq.1, $\rho = (\rho_1, \rho_2, \ldots, \rho_{N_x \cdot N_y})^T$ is a design vector composed of the design variables $\rho_e$ (e=1, 2, . . . , $N_x \cdot N_y$), and $\rho_{min}$ is a minimum allowable value for the design variables, and there is $\rho_{min} = 1E-6$; the total number of elements is $N_e = N_x \cdot N_y$; a bounded probabilistic uncertainty vector $X = (X_1, X_2, \ldots, X_m)^T$ comprises m uncertain material properties of the part structure; an interval uncertainty vector $I = (f_1, f_2, \ldots, f_n, \alpha_1, \alpha_2, \ldots, \alpha_n)^T$ comprises amplitudes $f_1, f_2, \ldots, f_n$ and direction angles $\alpha_1, \alpha_2, \ldots, \alpha_n$ of n uncertain external loads on the part structure.

$V(\rho)$ is the space utilization rate of the design domain, corresponding to a total material usage of the part structure, and $V_0$ is a volume of the design domain.

$g_q(\rho, X, I)$ is the $q^{th}$ constraint function; $u_q(\rho, X, I)$ is the displacement at the $q^{th}$ key point regarded as the $q^{th}$ constraint performance, which is a function of the design variables and the uncertainty variables, and for simplicity in the following, it is briefly recorded as $u_q$, and $u_{qcri}$ is a maximum allowable value thereof; P(•) calculates an occurrence probability of an event in a bracket, $P_q$ is a reliability index of the $q^{th}$ constraint performance, and $N_{con}$ is the number of constraint functions.

In an equilibrium equation $K(\rho,X)U = F(I)$ of the part structure, $K(\rho,X)$ is a $(2(N_x+1)(N_y+1)) \times (2(N_x+1)(N_y+1))$-dimensional global stiffness matrix, which is affected by the design vector $\rho$ and the bounded probabilistic uncertainty vector X; F(I) is a $(2(N_x+1)(N_y+1))$-dimensional nodal force vector, which is affected by the interval uncertainty vector I; U is a $(2(N_x+1)(N_y+1))$-dimensional nodal displacement vector; and $u_q$ is extracted from U according to $u_q = L_q^T U$.

In the $(2(N_x+1)(N_y+1))$-dimensional column vector $L_q$, except that the element at the position corresponding to the $q^{th}$ key point is 1, other elements are all 0.

5) Calculating the reliability of a constraint performance under bounded hybrid uncertainties:

5.1) Searching the worst working condition of constraint performance $u_q$ first:

5.1.1) Setting $\bar{X} = \mu_X = (\mu_{X_1}, \mu_{X_2}, \ldots, \mu_{X_m})$, where $\mu_{X_1}, \mu_{X_2}, \ldots, \mu_{X_m}$ are the means of the uncertainties $X_1, X_2, \ldots, X_m$; under the circumstances, the constraint performance $u_q$ is only affected by the interval uncertainty; and an uncertain external load $F_s$ (s=1, 2, . . . , n) is rewritten as its components in the horizontal and vertical directions such as $F_s = [f_s \cos \alpha_s, f_s \sin \alpha_s]^T$.

5.1.2) Based on a linear elastic hypothesis in small deformation, displacement $U_s$ caused by $F_s$ is calculated by Eq.2 based on $e_s^x = [1, 0]^T$, $e_s^y = [0 \ 1]^T$ and $F_s$, where $e_s^x$ and $e_s^y$ are respectively the element nodal forces in the horizontal and vertical directions at the point where $F_s$ exerts;

$$U_s = U_s^x + U_s^y = u_s^x f_s \cos \alpha_s + u_s^y f_s \sin \alpha_s = [u_s^x, u_s^y] \cdot F_s \qquad \text{Eq.2}$$

In Eq. 2, $u_s^x = [u_s^x \ 0]^T$ and $u_s^y = [0 \ u_s^y]^T$ are nodal displacement vectors calculated through the equilibrium equation of the part structure when only the elemental nodal force $e_s^x$ or $e_s^y$ acts, respectively.

5.1.3) Calculating the gradients of the constraint performance $u_q$ with respect to the amplitude and direction of an uncertain external load according to Eq.3 and Eq.4:

$$\frac{\partial u_q}{\partial f_s} = L_q^T \frac{\partial U}{\partial f_s} = L_q^T \sum_{i=1}^{n} \frac{\partial U_i}{\partial f_s} = L_q^T \cdot [u_s^x, u_s^y] \cdot [\cos \alpha_s, \sin \alpha_s]^T \qquad \text{Eq.3}$$

$$\frac{\partial u_q}{\partial \alpha_s} = L_q^T \frac{\partial U}{\partial \alpha_s} = L_q^T \sum_{i=1}^{n} \frac{\partial U_i}{\partial \alpha_s} = L_q^T \cdot [u_s^x, u_s^y] \cdot [-f_s \sin \alpha_s, f_s \cos \alpha_s]^T \qquad \text{Eq.4}$$

5.1.4) By utilizing the results of Eq.3 and Eq.4, solving the worst working condition $\tilde{I}_q$ by a gradient search algorithm, and the external load of the worst working condition is $F = \tilde{F}_q$ at the moment.

5.2) Restoring $\mu_X$ to X under the worst working condition $\tilde{I}_q$, so the constraint performance $\tilde{u}_q = u_q(\rho, X, \tilde{I}_q)$ under the worst working condition is only manifested as a probabilistic type, and solving the performance fluctuation under the worst working condition to evaluate reliability, details are as follows:

5.2.1) Calculating, according to Eq.5, a gradient of the constraint performance $\tilde{u}_q$ with respect to a bounded probabilistic uncertainty parameter $X_i$ (i=1, 2, . . . , m) under the worst working condition:

$$\frac{\partial \tilde{u}_q}{\partial X_i} = L_q^T \frac{\partial \tilde{U}}{\partial X_i} = -L_q^T K^{-1} \frac{\partial K}{\partial X_i} \tilde{U} = -L_q^T K^{-1} \left( \sum_{e=1}^{N_e} \rho_e^p \frac{\partial k_e}{\partial X_i} \right) \tilde{U} \qquad \text{Eq.5}$$

where a summation symbol is a combination operation of the element stiffness matrix defined by a finite element theory, $k_e$ is an element stiffness matrix, the nodal displacement vector $\tilde{U}$ under the worst working condition is obtained by solving the governing equation $K\tilde{U} = \tilde{F}_q$, and the penalty factor is generally p=3.

5.2.2) Based on the result of Eq.5, searching a bounded probabilistic uncertainty vector minimizing or maximizing $u_q(\rho, X, \tilde{I}_q)$ respectively according to Eq.6:

$$\begin{cases} X_q^L = \underset{X}{\operatorname{argmin}} u_q(\rho, X, \tilde{I}_q) \\ X_q^R = \underset{X}{\operatorname{argmax}} u_q(\rho, X, \tilde{I}_q) \end{cases} (q = 1, 2, \cdots, N_{con}) \qquad \text{Eq.6}$$

where corresponding to $X_q^L$ and $X_q^R$ the global stiffness matrix K is $K_q^L$ and $K_q^R$ respectively, which are uniformly marked as $K_q^*$ (*=L,R), and the nodal displacement vector $\tilde{U}$ is $\tilde{U}_q^L$ and $\tilde{U}_q^R$ respectively, which are uniformly marked as $\tilde{U}_q^*$ (*=L,R); and 5.2.3) Briefly recording $\tilde{u}_q^L = u_q(\rho, X_q^L, \tilde{I}_q)$ and $\tilde{u}_q^R = u_q(\rho, X_q^R, \tilde{I}_q)$, defining $[\tilde{u}_q^L, \tilde{u}_q^R]$ as the fluctuation of the constraint performance $u_q$ under the worst working condition, and calculating the reliability $\tilde{R}_q$ of the constraint performance according to Eq.7:

$$\tilde{R}_q = \frac{1}{2} \tanh \{ P \cdot (u_{qcri} - u_q^C) \cdot [1 + (P \cdot (u_{qcri} - u_q^C))^\gamma] \} + \frac{1}{2} \qquad \text{Eq.7}$$

where $u_q^C = (\tilde{u}_q^R + \tilde{u}_q^L)/2$ is a midpoint of the performance fluctuation under the worst working condition; a multiplier is $P = 1/(u_q^W - \varepsilon^u)$, where $\varepsilon^u$ is a small constant for adjusting the reliability at the boundary position of the performance fluctuation under the worst working condition, the value of which is recommended as $\varepsilon''=0.00\sim0.05u_q^W$ based on actual tests; $u_q^W=(\tilde{u}_q^R-\tilde{u}_q^L)/2$ is a radius of the performance fluctuation under the worst working condition; $\gamma\in\{2i|i\in N^+\}$ is a regulatory factor.

The constraint function in Eq.1 can be rewritten as Eq.8:

$$g_q(\rho,X,I)=-\bar{R}_q+P_q\leq 0 \ (q=1,2,\ldots,N_{con}) \quad \text{Eq.8}$$

6) Calculating the gradients of the objective and constraint functions with respect to the design variables:
6.1) Calculating the gradient of the objective function through Eq.9:

$$\frac{\partial V(\rho)}{\partial \rho_e}=\frac{1}{V_0}(e=1,2,\cdots,N_e) \quad \text{Eq.9}$$

6.2) Solving the gradients of the constraint functions as follows:
6.2.1) Writing a gradient expression of $g_q(\rho,X,I)$ according to a chain rule, as shown in Eq.10:

$$\frac{\partial g_q(\rho, X, I)}{\partial \rho_e}=$$

$$\frac{\partial g_q(\rho, X, I)}{\partial \tilde{u}_q^L}\frac{\partial \tilde{u}_q^L}{\partial \rho_e}+\frac{\partial g_q(\rho, X, I)}{\partial \tilde{u}_q^R}\frac{\partial \tilde{u}_q^R}{\partial \rho_e}(e=1,2,\cdots,N_e)$$

6.2.2) Describing the function in the bracket of $\tanh(\cdot)$ in Eq.7 as $R(u_{qcri})$, the gradient terms $\partial g_q(\rho,X,I)/\partial \tilde{u}_q^L$ and $\partial g_q(\rho,X,I)/\partial \tilde{u}_q^R$ in Eq.10 can be calculated according to Eq.11:

$$\frac{\partial g_q(\rho, X, I)}{\partial \tilde{u}_q^*}=\frac{\text{sech}^2(R(u_{qcri}))}{2}\cdot\frac{\partial R(u_{qcri})}{\partial \tilde{u}_q^*}(*=L,R) \quad \text{Eq.11}$$

where the gradient term $\partial R(u_{qcri})/\partial \tilde{u}_q^*$ is specifically as follows:

$$\frac{\partial R(u_{qcri})}{\partial \tilde{u}_q^L}=\frac{u_{qcri}-u_q^C}{2P^2}-\frac{P}{2}+\frac{(u_{qcri}-u_q^C)^{\gamma+1}}{2P^2}-\frac{P(\gamma+1)}{2}(u_{qcri}-u_q^C)^\gamma \quad \text{Eq.12}$$

$$\frac{\partial R(u_{qcri})}{\partial \tilde{u}_q^R}=$$

$$-\frac{u_{qcri}-u_q^C}{2P^2}-\frac{P}{2}-\frac{(u_{qcri}-u_q^C)^{\gamma+1}}{2P^2}-\frac{P(\gamma+1)}{2}(u_{qcri}-u_q^C)^\gamma$$

6.2.3) Giving the gradient terms $\partial \tilde{u}_q^L/\partial \rho_e$ and $\partial \tilde{u}_q^R/\partial \rho_e$ in Eq.10 in a uniform form according to the SIMP framework:

$$\frac{\partial \tilde{u}_q^*}{\partial \rho_e}=-L_q^T(K_q^*)^{-1}\frac{\partial K_q^*}{\partial \rho_e}\tilde{U}_q^*(*=L,R) \quad \text{Eq.14}$$

where $K_q^*$ and $\tilde{U}_q^*$ (*=L, R) are defined in 5.2.2; and the gradient term $\partial K_q^*/\partial \rho_e$ is calculated according to Eq.15:

$$\frac{\partial K_q^*}{\partial \rho_e}=p\rho_e^{p-1}\langle k_{eq}^*\rangle(*=L,R) \quad \text{Eq.15}$$

where $k_{eq}^*$ is the element stiffness matrix extracted from $K_q^*$, and $\langle k_{eq}^*\rangle$ is a square matrix reconstructed by performing a combined operation on the elements in $k_{eq}^*$ according to the element stiffness matrix, and is consistent with $K_q^*$ in dimensionality.

6.2.4) Substituting all the gradient terms in Eq.11 to Eq.15 into Eq.10 to obtain the gradient of the constraint function $g_q(\rho,X,I)$.

7) Updating the design variables by using a moving asymptote algorithm based on the gradients of the objective and constraint functions with regard to the design variables; and checking the difference between the objective function values in the current and previous iterations, for the first iteration, defining the difference as the objective function value, and if the difference is less than a convergence threshold, outputting the updated design variables, otherwise repeating steps 5) to 7).

The present disclosure has the beneficial effects:

1) Following uncertainties in the manufacture and service processes of the part structure are considered: material properties of the part structure, and the amplitude and direction of the external load. Since sufficient sample information of the external load is difficult to obtain, the uncertainties of amplitude and direction are regarded as the interval uncertainties; and the property of a base material with sufficient sample information is regarded as the bounded probabilistic uncertainty, which is described as a random variable subject to generalized beta distribution, so that the defect of only considering probabilistic or interval uncertainty in existing reliability-based topology optimization design method is overcome, and the constructed reliability-based topology optimization design model for the part structure better conforms to engineering practice.

2) An explicit expression of the constraint performance with respect to design variables and uncertainty parameters is established by a classic finite element framework; and the hypothesis of linear elastic deformation is introduced, the final deformation of the structure is obtained by superposing the deformation produced by the separate action of every external load, and then the gradient information of the constraint performance with regard to an uncertain external load is calculated, so that the worst working condition corresponding to the worst constraint performance of the structure is obtained, and a theoretical basis is provided for guaranteeing the safe service of the structure.

3) The performance fluctuation under the worst working condition is defined, and a mathematical expression for calculating the reliability of the constraint performance under the hybrid uncertainty condition is given; existing reliability-based topology optimization methods considering multiple constraint performance have the defects that the most probable points for the failures of multiple constraint performance are subjectively chosen, an uncertainty covariance-correlation matrix needs to be solved additionally, and reliability expressions usually contain conditional judgment; and compared with the above existing methods, the method of the present disclosure fundamentally avoids solving the most probable points, and investigates the complete ranges of constraint performance by using the boundedness of the hybrid uncertainties, no additional conditional judgment is required by the mathematical expression for the reliability of constraint performance,

DESCRIPTION OF EMBODIMENTS

The present disclosure is further described below in conjunction with the accompanying drawings and specific example.

Figure 1:
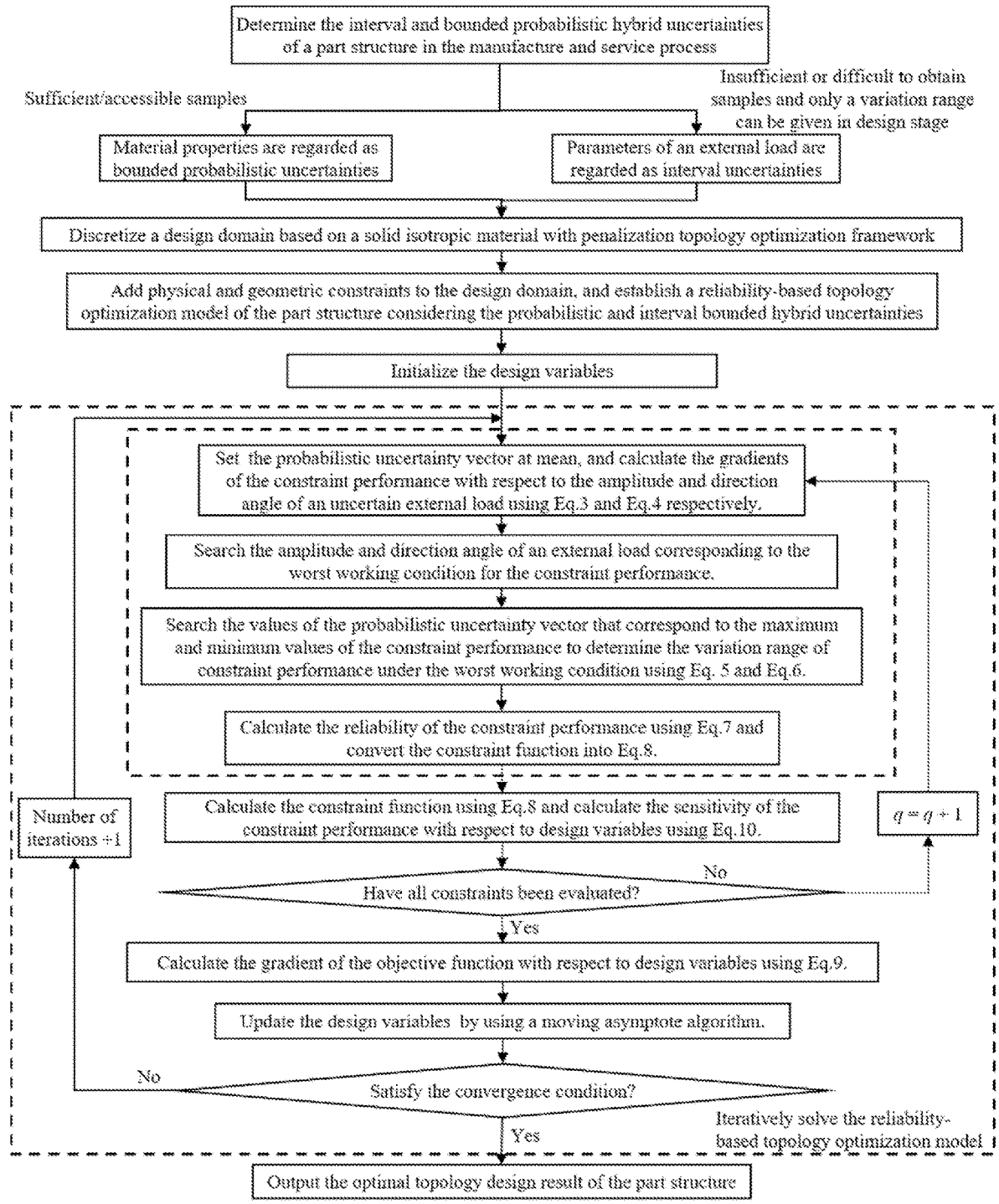
FIG. 1 is a flow diagram of reliability-based topology optimization design for a part structure considering bounded hybrid uncertainties.

The information involved in the drawings is the actual application data in reliability-based topology optimization design for a support structure in the outer cutterhead of a certain type of tunnel boring mechanism in the present disclosure, and FIG. 1 is a flow diagram of reliability-based topology optimization design for a part structure considering bounded hybrid uncertainties.

Figure 2:
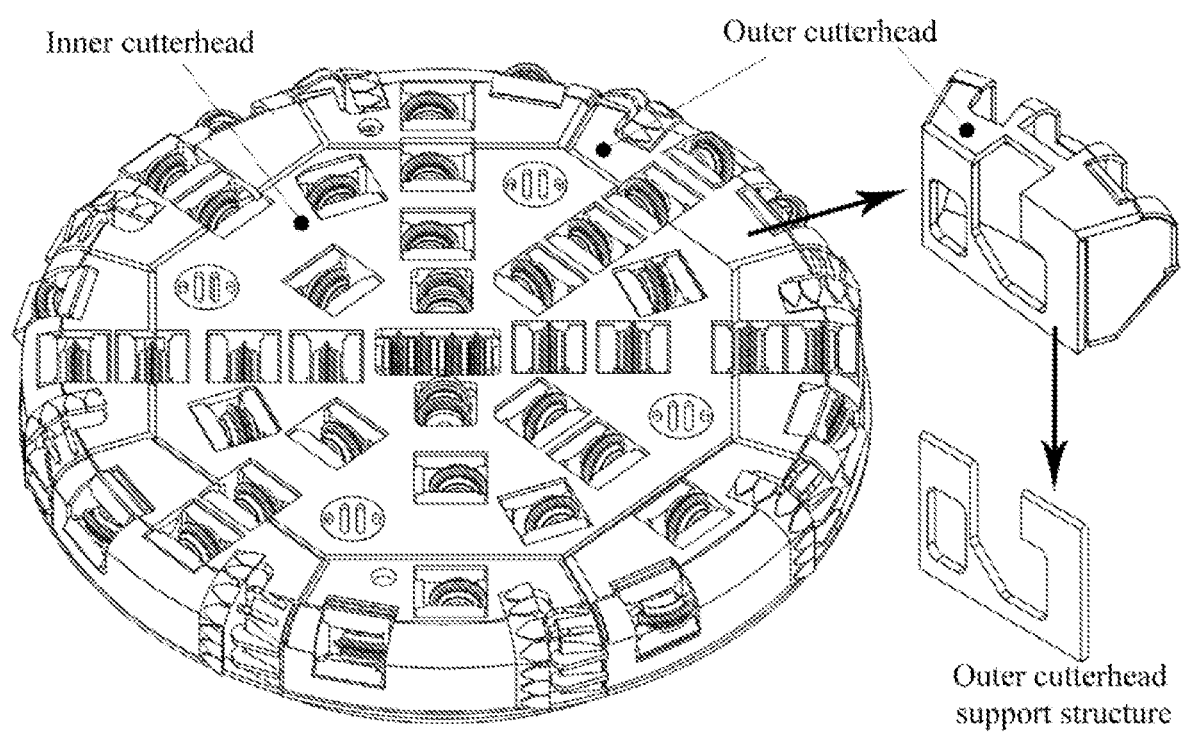
FIG. 2 is a three-dimensional external view of a certain type of tunnel boring mechanism and a schematic diagram of a support structure in the outer cutterhead.
Figure 3:
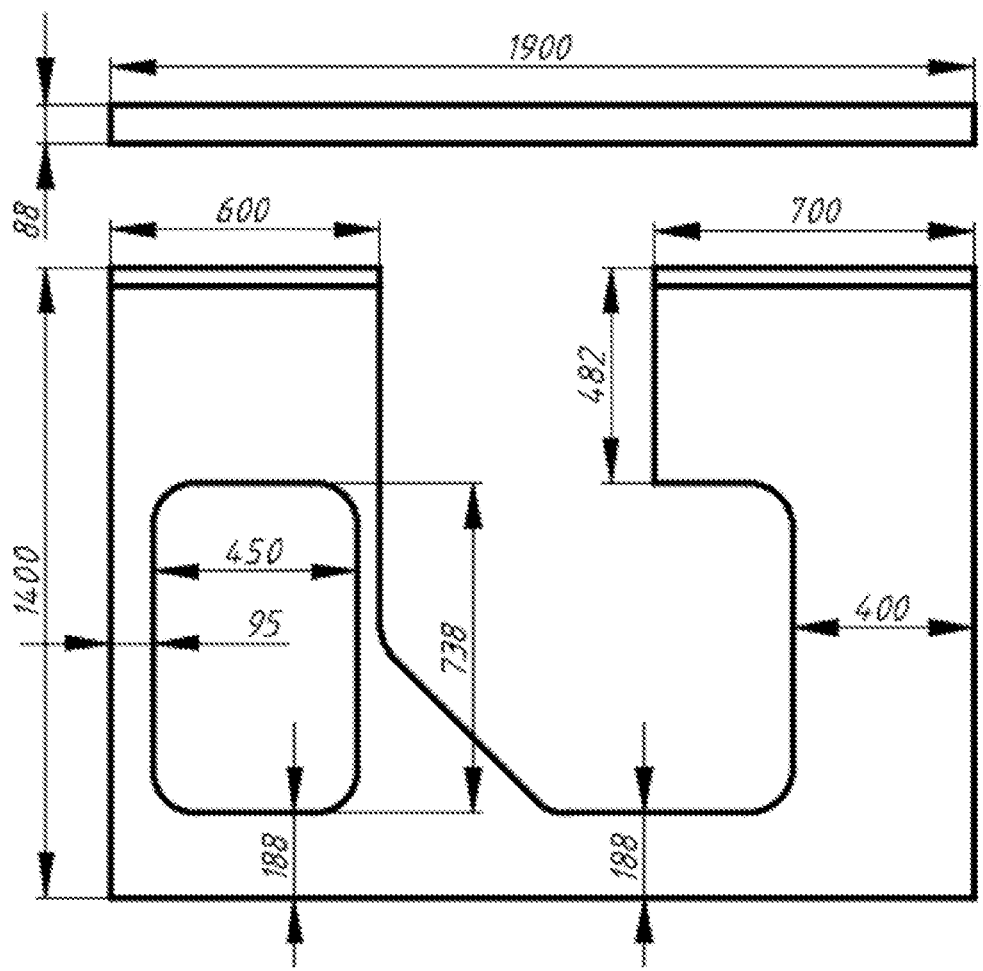
FIG. 3 is an initial design diagram for a support structure in the outer cutterhead.
Figure 4:
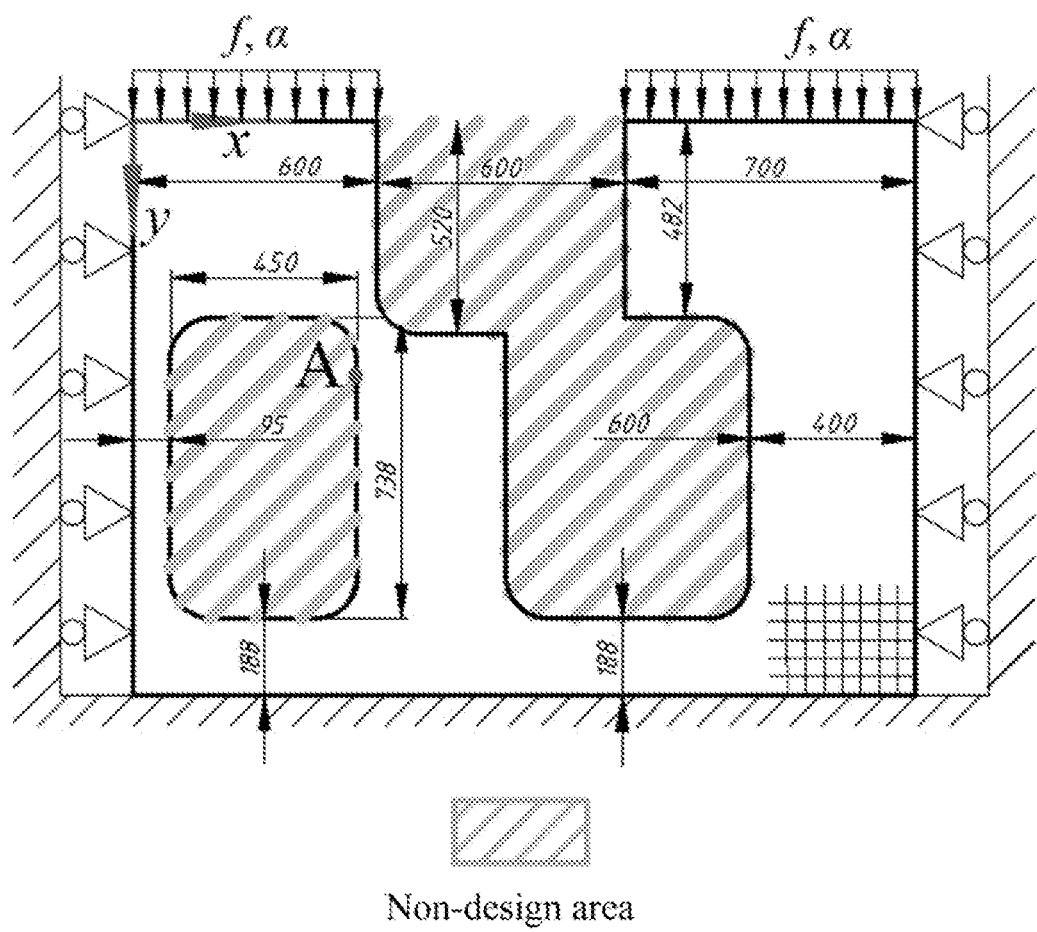
FIG. 4 is a schematic diagram of the design domain for the reliability-based topology optimization of a support structure in the outer cutterhead.

1. By taking the outer cutterhead support structure in a certain type of tunnel boring mechanism which is made of a high-strength low-alloy steel material as shown in FIG. 2 as the research object, the uncertainties of the support structure in the processes of manufacture and service are considered:

1.1) FIG. 3 illustrates the relevant dimensions of an initial design of the outer cutterhead support structure of the tunneling boring mechanism, and FIG. 4 is a boundary condition set for the reliability-based topology optimization. The support structure bears an axial load at its top transmitted by the outer cutterhead in the cutting movement process of the tunneling boring mechanism; since the support structure is flat, the optimization problem is simplified into a problem in a two-dimensional plane, and the load is considered as one uniformly distributed linear load herein, with its amplitude and direction being uncertain due to the fluctuation of physical properties of the rock strata being cut; but it is difficult to measure the external load in the working process of the tunneling boring mechanism, and it is difficult to obtain sufficient sample information of the external load, thus its amplitude f and direction angle α are regarded as interval uncertainties.

1.2) The Young's modulus $E_M$ and Poisson ratio $v_M$ of high-strength low-alloy steel used by the support structure in the outer cutterhead have relatively obvious uncertainties due to the non-uniformity of raw material physical properties, the fluctuation of a metallurgical process and so on, but sufficient sample information can be obtained by measuring finished products, so they can be regarded as bounded probabilistic uncertainties and described as random variables subject to generalized beta distributions; and the uncertainty information is summarized in Table 1.

TABLE 1

Summary of the uncertainty information of the support structure in the outer cutterhead of the tunneling boring mechanism

| Uncertainty | Type of uncertainty variable | Value range | Uncertain parameter* |
|---|---|---|---|
| $E_M$ (GPa) | Bounded probabilistic variable $\alpha_{EM} = 5.30, \beta_{EM} = 6.28$ | [200.00, 210.00] | $\mu_{EM} = 206.00$, $\sigma_{EM} = 1.20$ |
| $v_M$ | Bounded probabilistic variable $\alpha_{vM} = \beta_{vM} = 5.32$ | [0.28, 0.32] | $\mu_{vM} = 0.30$, $\sigma_{vM} = 5.00E-3$ |
| f (kN/m) | Interval variable | [85.4, 87.4] | <86.4, 1.0> |
| A | Interval variable | [−105.00°, −75.00°] | <−90.00°, 15.00°> |

*Midpoint and radius for interval variables; mean value and standard deviation for bounded probabilistic variables.

2. The design domain of the support structure is discretized, which is specifically as follows:

The support structure in the outer cutterhead of the tunneling boring mechanism is flat, so its force condition is simplified into a two-dimensional plane stress state; the support structure to be optimized is placed in a regular rectangular design domain (a range defined by an outermost solid line in FIG. 4, with the dimension being X×Y=1900 mm×1400 mm), the rectangular design domain is divided into $N_x \times N_y$ square elements, where $N_x$ and $N_y$ are the numbers of divisions along x, y axes, respectively, which are $N_x=190$ and $N_y=140$ in the design; and based on the classic SIMP framework for topology optimization, each element is imparted with a unique design variable $\rho_e \in [0,1]$ (e=1, 2, . . . , 190×140)

3. According to the classic finite element method, physical and geometric constraints are imposed on the discretized support structure of the outer cutterhead, which is specifically as follows:

3.1) Physical constraints: all elements at the bottom of the support structure in FIG. 4 are set as fixed constraints, and displacement in the y direction is allowed at both left and right sides; and a uniformly distributed linear load is applied at the top of the support structure in FIG. 4, which has an uncertain amplitude f and an uncertain direction angle α.

3.2) Geometric constraints: as shown in FIG. 4, slash regions in the design domain Ω are non-design areas, setting design variables corresponding to the elements in the non-design areas as $\rho_e=0$, and keeping their values unchanged in subsequent optimization process.

4. A space utilization rate of the design domain is taken as an objective function and it is considered that displacements $u_{xA}$ and $u_{yA}$ in x and y directions of point A (552, 413) which deforms remarkably in both a normal working condition and a critical state of the outer cutterhead support structure under the joint influence of interval and bounded probabilistic hybrid uncertainties are reliability constraint performance; allowable values are $u_{xAcri}=0.4$ mm and $u_{yAcri}=1.0$ mm, respectively; and a reliability-based topology optimization design model of the support structure in the outer cutterhead is established under the reliability requirement $P_{xA}=P_{yA}=0.98$, which is as shown in Eq.16:

$$\min_{\rho} V(\rho) = \sum_{e=1}^{190\times140} \rho_e/(190\times140) \quad \text{Eq.16}$$

$$s.t.g_{xA}(\rho, X, I) = -P(u_{xA}(\rho, X, I) \leq u_{xAcri}) + P_{xA} \leq 0$$

$$g_{yA}(\rho, X, I) = -P(u_{yA}(\rho, X, I) \leq u_{yAcri}) + P_{yA} \leq 0$$

$$K(\rho, X)U = F(I) 0 \leq \rho_{min} \leq \rho_e \leq 1 (e = 1, 2, \cdots, 190\times140)$$

$$X = (E_M, v_M)^T, I = (f, \alpha)^T$$

where $\rho=(\rho_1, \rho_2, \ldots, \rho_{190\times140})^T$ is a design vector, and the minimum allowable value of all design variables is $\rho_{min}=0.001$; $X=(E_M,v_M)^T$ is a bounded probabilistic uncertainty vector; $I=(f,\alpha)^T$ is an interval uncertainty vector; $V(\rho)$ is the space utilization rate in the design domain corresponding to the total material usage; $g_{xA}(\rho,X,I)$ and $g_{yA}(\rho,X,I)$ are constraint functions; constraint performance $u_{xA}(\rho,X,I)$ and $u_{yA}(\rho,X,I)$ are the functions of the design variables and the uncertainty variables, which are briefly recorded as $u_{xA}$ and $u_{yA}$ in the following for the purpose of simplicity.

$K(\rho,X)U=F(I)$ $K(\rho,X)$ is an equilibrium equation, where $K(\rho,X)$ is a $2(191\times141)\times2(191\times141)$-dimensional global stiffness matrix; $F(I)$ is a $2(191\times141)$-dimensional nodal force vector; and U is a $2(191\times141)$-dimensional nodal displacement vector.

5. Reliability of the constraint performance under the hybrid uncertainties are calculated, which is explained in detail by taking $g_{xA}(\rho,X,I)$ as an example in the following:

5.1) The worst working condition of constraint performance $u_{xA}$ is searched first:

5.1.1) Setting $X=\mu_X=(\mu_{E_M},\mu_{v_M})^T$, where $\mu_{E_M},\mu_{v_M}$ are the means of the uncertainties $E_M,v_M$. Under the circumstance, the constraint performance $u_{xA}$ is only affected by the interval uncertainty; and an uncertain external load is rewritten as its components in horizontal and vertical directions such as $F=[f\cos\alpha, f\sin\alpha]^T$.

5.1.2) Based on a linear elastic hypothesis in small deformation, displacement U caused by F is calculated by Eq.17 based on $e^x=[1,0]^T$, $e^y=[0,1]^T$ and F, where $e^x$ and $e^y$ are respectively the element nodal forces in the horizontal and vertical directions at the point where F exerted;

$$U=U^x+U^y=u^x f\cos\alpha+u^y f\sin\alpha=[u^x,u^y]\cdot F \quad \text{Eq.17}$$

where $u_x=[u^x,0]^T$ and $u^y=[0,u^y]^T$ are respectively the nodal displacement vectors calculated through the equilibrium equation when only the element nodal force $e^x$ or $e^y$ acts;

5.1.3) The gradients of the constraint performance with respect to the amplitude and direction of an uncertain external load are calculated according to Eq.18 and Eq.19:

$$\frac{\partial u_{xA}}{\partial f} = L_{xA}^T \cdot [u^x, u^y] \cdot [\cos\alpha, \sin\alpha]^T \quad \text{Eq.18}$$

$$\frac{\partial u_{xA}}{\partial \alpha} = L_{xA}^T \cdot [u^x, u^y] \cdot [-f\sin\alpha, f\cos\alpha]^T \quad \text{Eq.19}$$

5.1.4) By utilizing the results of Eq.18 and Eq.19, the worst working condition $\tilde{I}_{xA}$ is solved by the gradient search algorithm, and the external load of the worst working condition is $F=\tilde{F}_{xA}$ at the moment.

5.2) $\mu_X$ is restored to X under the worst working condition $\tilde{I}_{xA}$, so the constraint performance $\tilde{u}_{xA}=u_{xA}(\rho,X,\tilde{I}_{xA})$ under the worst working condition is only manifested as a probabilistic type, and the performance fluctuation under the worst working condition is solved to evaluate reliability, details being as follows:

5.2.1) According to Eq.20 and Eq.21, the gradients of the constraint performance $\tilde{u}_{xA}$ with respect to the bounded probabilistic uncertainties $E_M, v_M$ under the worst working condition $\tilde{I}_{xA}$ are calculated:

$$\frac{\partial \tilde{u}_{xA}}{\partial E_M} = -L_{xA}^T K^{-1}\left(\sum_{e=1}^{190\times140} \rho_e^3 \frac{\partial k_e}{\partial E_M}\right)\tilde{U} \quad \text{Eq.20}$$

$$\frac{\partial \tilde{u}_{xA}}{\partial v_M} = -L_{xA}^T K^{-1}\left(\sum_{e=1}^{190\times140} \rho_e^3 \frac{\partial k_e}{\partial v_M}\right)\tilde{U} \quad \text{Eq.21}$$

where a summation symbol is a combined operation of element stiffness matrix defined by the finite element theory, $k_e$ is an element stiffness matrix, and the nodal displacement vector $\tilde{U}$ under the worst working condition is obtained by solving the governing equation $K\tilde{U}=\tilde{F}_{xA}$; and the penalty factor is p=3;

5.2.2) Based on results of Eq.20 and Eq.21, searching a bounded probabilistic uncertainty vector minimizing or maximizing $\tilde{u}_{xA}=u_{xA}(\rho,X,\tilde{I}_{xA})$ respectively according to Eq.22:

$$\begin{cases} X_{xA}^L = \arg\min_X u_{xA}(\rho, X, \tilde{I}_{xA}) = [200.05, 0.287]^T \\ X_{xA}^R = \arg\max_X u_{xA}(\rho, X, \tilde{I}_{xA}) = [210.00, 0.309]^T \end{cases} \quad \text{Eq.22}$$

where corresponding to $X_{xA}^L$ and $X_{xA}^R$, the global stiffness matrix K is $K_{xA}^L$ and $K_{xA}^R$ respectively, which are uniformly marked as $K_{xA}^*$ (*=L, R), and the nodal displacement vector $\tilde{U}$ is $\tilde{U}_{xA}^L$ and $\tilde{U}_{xA}^R$ respectively, which are uniformly marked as $\tilde{U}_{xA}^*$ (*=L,R); and 5.2.3) $\tilde{u}_{xA}^L=u_{xA}(\rho,X_{xA}^L,\tilde{I}_{xA})=0.492$ mm and $\tilde{u}_{xA}^R=u_{xA}(\rho,X_{xA}^R,\tilde{I}_{xA})=0.533$ mm are briefly recorded, $[\tilde{u}_{xA}^L,\tilde{u}_{xA}^R]=[0.492,0.533]$ mm is defined as the fluctuation of the constraint performance $u_{xA}$ under the worst working condition; $\varepsilon^u=0$ and $\gamma=4$ are set, and the reliability $\tilde{R}_{xA}$ of the constraint performance is calculated according to Eq.23:

$$\tilde{R}_{xA} = \frac{1}{2}\tanh\{P\cdot(u_{xAcri}-u_{xA}^C)\cdot[1+(P\cdot(u_{xAcri}-u_{xA}^C))^\gamma]\}+\frac{1}{2} = 0.0104 \quad \text{Eq.23}$$

6. The gradients of the objective function $V(\rho)$ and the constraint functions $g_{xA}(\rho,X,I)$ and $g_{yA}(\rho,X,I)$ with respect to the design variables are calculated as follows:

6.1) The gradient of the objective function is given by Eq.24:

$$\frac{\partial V(\rho)}{\partial \rho_e} = \frac{1}{190 \times 140}(e = 1, 2, \cdots, 190 \times 140) \quad \text{Eq.24}$$

6.2) The gradient solution process of the constraint functions is explained in detail by taking $g_{xA}(\rho,X,I)$ as an example:

6.2.1) A gradient expression of $g_{xA}(\rho,X,I)$ is written according to a chain rule, as shown in Eq.25:

$$\frac{\partial g_{xA}(\rho, X, I)}{\partial \rho_e} = \frac{\partial g_{xA}(\rho, X, I)}{\partial \tilde{u}_{xA}^L}\frac{\partial \tilde{u}_{xA}^L}{\partial \rho_e} + \frac{\partial g_{xA}(\rho, X, I)}{\partial \tilde{u}_{xA}^R}\frac{\partial \tilde{u}_{xA}^R}{\partial \rho_e}(e = 1, 2, \cdots, 190 \times 140) \quad \text{Eq.25}$$

6.2.2) A function in the bracket of tanh(•) in Eq.23 is recorded as $R(u_{xAcri})$ so the gradient terms $\partial g_{xA}(\rho,X,I)/\partial \tilde{u}_{xA}^L$ and $\partial g_{xA}(\rho,X,I)/\partial \tilde{u}_{xA}^R$ in Eq.25 can be calculated according to Eq.26:

$$\frac{\partial g_{xA}(\rho, X, I)}{\partial \tilde{u}_{xA}^*} = \frac{\text{sech}^2(R(u_{xAcri}))}{2} \cdot \frac{\partial R(u_{xAcri})}{\partial \tilde{u}_{xA}^*}(* = L, R) \quad \text{Eq.26}$$

where the gradient term $\partial R(u_{xAcri})/\partial \tilde{u}_{xA}^*$ is specifically:

$$\frac{\partial R(u_{xAcri})}{\partial \tilde{u}_{xA}^L} = \frac{u_{xAcri} - u_{xA}^C}{2P^2} - \frac{P}{2} + \frac{(u_{xAcri} - u_{xA}^C)^{\gamma+1}}{2P^2} - \frac{P(\gamma+1)}{2}(u_{xAcri} - u_{xA}^C)^\gamma \quad \text{Eq. 27}$$

$$\frac{\partial R(u_{xAcri})}{\partial \tilde{u}_{xA}^R} = -\frac{u_{xAcri} - u_{xA}^C}{2P^2} - \frac{P}{2} - \frac{(u_{xAcri} - u_{xA}^C)^{\gamma+1}}{2P^2} - \frac{P(\gamma+1)}{2}(u_{xAcri} - u_{xA}^C)^\gamma \quad \text{Eq. 28}$$

6.2.3) The gradient terms $\partial \tilde{u}_{xA}^L/\partial \rho_e$ and $\partial \tilde{u}_{xA}^R/\partial \rho_e$ in Eq.25 are given in a uniform form according to the SIMP framework:

$$\frac{\partial \tilde{u}_{xA}^*}{\partial \rho_e} = -L_{xA}^T (K_{xA}^*)^{-1} \frac{\partial K_{xA}^*}{\partial \rho_e}\tilde{U}_{xA}^* (*=L,R) \quad \text{Eq. 29}$$

where $K_{xA}^*$ and $\tilde{U}_{xA}^*$ (*=L,R) are defined in 5.2.2; and the gradient term $\partial K_{xA}^*/\partial \rho_e$ is calculated according to Eq.30:

$$\frac{\partial K_{xA}^*}{\partial \rho_e} = p\rho_e^{p-1}\langle k_{exA}^*\rangle(*=L,R) \quad \text{Eq. 30}$$

where $k_{exA}^*$ is the element stiffness matrix extracted from $K_{xA}^*$ and $\langle k_{exA}^*\rangle$ is a square matrix reconstructed by performing a combined operation on elements in $k_{exA}^*$ according to the element stiffness matrix, and is consistent with $K_{xA}^*$ in dimensionality; and 6.2.4) All the gradient terms in Eq.26 to Eq.30 are substituted into Eq.25 to obtain the gradient of the constraint function $g_{xA}(\rho,X,I)$;

$$\frac{\partial g_{xA}(\rho, X, I)}{\partial \rho_2} = 355.29, \ldots, \frac{\partial g_{xA}(\rho, X, I)}{\partial \rho_{10 \times 70}} = -171.04, \quad \text{Eq. 31}$$

$$\ldots, \frac{\partial g_{xA}(\rho, X, I)}{\partial \rho_{190 \times 140}} = -395.63$$

7. The design variable is updated by using a moving asymptote algorithm as follows:

$$\rho_1=0.76, \rho_2=0.76, \ldots, \rho_{10\times70}=0.31, \ldots, \rho_{190\times 140}=0.78 \quad \text{Eq. 32}$$

The difference between the objective function values in the current and previous iterations is checked, since it is the first iteration, the difference is defined as the current objective function value, which does not meet a convergent threshold value 0.01, and steps 5 to 7 are repeated; and A finally obtained optimal solution is partially cut out as follows:

$$\rho_1=1.00, \rho_2=1.00, \ldots, \rho_{10\times 70}=1E-3, \ldots, \rho_{190\times 140}=1.00 \quad \text{Eq.33}$$

Figure 5:
FIG. 5 is the result of the reliability-based topology optimization design of a support structure in the outer cutterhead.
Figure 6:
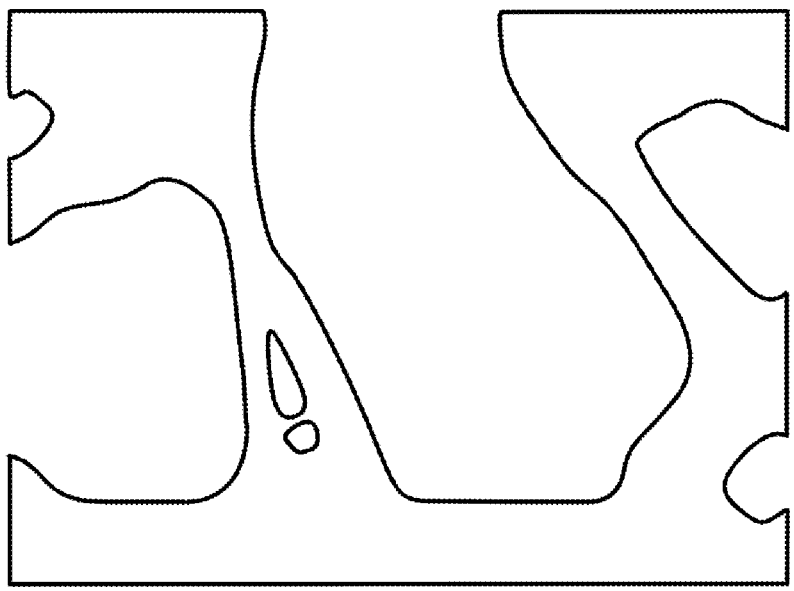
FIG. 6 is a final design diagram of a support structure in the outer cutterhead obtained by smoothing the result of the reliability-based topology optimization design.

Iterative optimization converges at the 143$^{rd}$ generation, and the topological structure corresponding to the optimal solution is shown in FIG. 5; and the optimal objective performance is V(ρ)=0.4388 while the reliability of constraint performance $u_{xA}$ and $u_{yA}$ at the optimal solution is 0.9920 and 0.9894 respectively, which meet the reliability design requirement for the support structure in the outer cutterhead of the tunnel boring mechanism. After further smoothing the contour of the result of reliability-based topology optimization design, the final design of the support structure in the outer cutterhead of the tunnel boring mechanism is shown in FIG. 6.

It is to be noted that the content and specific implementations of the present disclosure are intended to prove the practical application of the technical solution provided by the present disclosure, and should not be interpreted as limiting the scope of protection of the present disclosure. Any modification and change of the present disclosure within the scope of protection of the spirit of the present disclosure and the claims fall within the scope of protection of the present disclosure.

What is claimed is:

1. A reliability-based topology optimization design method for a part structure considering bounded hybrid uncertainties, comprising:
   step 1) considering following uncertainties in manufacture and service processes of the part structure: regarding an amplitude and a direction of an external load with insufficient sample information as interval uncertainties, regarding a material property of the part structure with sufficient sample information as a bounded probabilistic uncertainty, and describing a bounded probabilistic uncertainty parameter as a random variable subject to generalized beta distribution;
   step 2) discretizing a design domain of the part structure, comprising:
   simplifying a force condition of the part structure into a two-dimensional plane stress state, retaining installation holes and removing structural details to improve calculating efficiency, placing the simplified part structure in a regular rectangular design domain, dividing the rectangular design domain into $N_x \times N_y$ square elements, where $N_x$ and $N_y$ are numbers of divisions along x, y axes, respectively; and imparting, based on a solid isotropic material with penalization (SIMP) topology optimization framework, each element with a unique design variable $\rho_e \in [0,1]$ (e=1,2, ..., $N_x \cdot N_y$);

step 3) imposing physical constraints and geometric constraints on the discretized structure, comprising:

step 3.1) imposing the physical constraints including fixing or supporting and an external load according to a classical finite element method, which comprises setting the zero displacement at nodes with a constrained degree of freedom, and specifying the node where an external load is applied; and step 3.2) the geometric constraints including specified holes in the structure and areas where materials are forcibly retained, setting design variables corresponding to elements in the holes as $\rho$hd e≡0, setting design variables corresponding to elements in the areas where the materials are forcibly retained as $\rho_e \equiv 1$, and keeping values of the design variables corresponding to elements in the holes and the areas where the materials are to be retained unchanged in subsequent optimization process;

step 4) establishing, by taking a space utilization rate of the design domain as an objective function and taking displacements of several key points of the part structure under a joint influence of interval and bounded probabilistic hybrid uncertainties as reliability constraint performance, a reliability-based topology optimization design model for the part structure, as shown in Eq.1:

$$\min_{\rho} V(\rho) = \sum_{e=1}^{N_e} \rho_e / V_0 \qquad \text{Eq. 1}$$

s.t. $g_q(\rho, X, I) = -P(u_q(\rho, X, I) \leq u_{qcri}) + P_q \leq 0$ $(q = 1, 2, \ldots, N_{con})$ $K(\rho, X)U = F(I)$ $0 \leq \rho_{min} \leq \rho_e \leq 1 \ (e = 1, 2, \ldots, N_e)$ $X = (X_1, X_2, \ldots, X_m)^T, I = (f_1, f_2, \ldots, f_n, \alpha_1, \alpha_2, \ldots, \alpha_n)^T$ where in Eq. 1, $\rho=(\rho_1, \rho_2, \ldots, \rho_{N_x \cdot N_y})^T$ is a design vector composed of design variables $\rho_e$(e=1,2, ..., $N_x \cdot N_y$), and $\rho_{min}$ is a minimum allowable value for the design variables; a total number of elements is $N_e = N_x \cdot N_y$; a bounded probabilistic uncertainty vector $X=(X_1, X_2, \ldots, X_m)^T$ comprises m uncertain material properties of the part structure; an interval uncertainty vector $I=(f_1, f_2, \ldots, f_n, \alpha_1, \alpha_2, \ldots, \alpha_n)^T$ comprises amplitudes $f_1, f_2, \ldots, f_n$ and direction angles $\alpha_1, \alpha_2, \ldots, \alpha_n$ of n uncertain external loads on the part structure;

where $V(\rho)$ is the space utilization rate of the design domain, corresponding to a total material usage of the part structure, and $V_0$ is a volume of the design domain; where $g_q(\rho,X,I)$ is a $q^{th}$ constraint function; $u_q(\rho,X,I)$ is a displacement at a $q^{th}$ key point regarded as a $q^{th}$ constraint performance5, denoted as $u_q$ for short, and $u_{qcri}$ is an allowable maximum value of $u_q(\rho, X, I)$; P(•) calculates an occurrence probability of an event in a bracket, $P_q$ is a reliability index of the $q^{th}$ constraint performance, and $N_{con}$ is a number of constraint functions; and where in an equilibrium equation $K(\rho,X)U=F(I)$ of the part structure, $K(\rho,X)$ is a $(2(N_x+1)(N_y+1)) \times (2(N_x+1)(N_y+1))$-dimensional global stiffness matrix, which is affected by the design vector $\rho$ and the bounded probabilistic uncertainty vector X; F(I) is a $(2(N_x+1)(N_y+1))$-dimensional nodal force vector affected by the interval uncertainty vector I; U is a $(2(N_x+1)(N_y+1))$-dimensional nodal displacement vector; and $u_q$ is extracted from U according to $u_q=L_q^T U$, wherein in a $(2(N_x+1)(N_y+1))$-dimensional column vector $L_q$, the element at a position corresponding to the $q^{th}$ key point is 1, and other elements are all 0;

step 5) calculating reliability of a constraint performance under bounded hybrid uncertainties, comprising:

step 5.1) searching a worst working condition of constraint performance $u_q$, comprising:

step 5.1.1) setting $X=\mu_X=(\mu_{X_1}, \mu_{X_2}, \ldots, \mu_{X_m})$, where $\mu_{X_1}, \mu_{X_2}, \ldots, \mu_{X_m}$ are means of uncertainties $X_1, X_2, \ldots, X_m$, the constraint performance $u_q$ is only affected by the interval uncertainty vector; and an uncertain external load $F_s$(s=1,2, ..., n) is rewritten as its components in horizontal and vertical directions such as $F_s=[f_s \cos \alpha_s, f_s \sin \alpha_s]^T$;

step 5.1.2) calculating, based on a linear elastic hypothesis in small deformation, displacement $U_s$ caused by $F_s$ according to Eq.2 based on $e_s^x=[1\ 0]^T$, $e_s^y=[0\ 1]^T$ and $F_s$, where $e_s^x$ and $e_s^y$ are respectively element nodal forces in the horizontal and vertical directions at an point where $F_s$ exerts;

$$U_s = U_s^x + U_s^y = u_s^x f_s \cos \alpha_s + u_s^y f_s \sin \alpha_s = [u_s^x, u_s^y] \cdot F_s \qquad \text{Eq.2}$$

where $u_s^x=[u_s^x\ 0]^T$ and $u_s^y=[0\ u_s^y]^T$ are respectively nodal displacement vectors calculated through the equilibrium equation of the part structure when only the element nodal force $e_s^x$ or $e_s^y$ acts;

step 5.1.3) calculating gradients of the constraint performance $u^q$ with respect to an amplitude and a direction of an uncertain external load according to Eq.3 and Eq.4:

$$\frac{\partial u_q}{\partial f_s} = L_q^T \frac{\partial U}{\partial f_s} = L_q^T \sum_{i=1}^{n} \frac{\partial U_i}{\partial f_s} = L_q^T \cdot [u_s^x, u_s^y] \cdot [\cos\alpha_s, \sin\alpha_s]^T \qquad \text{Eq. 3}$$

$$\frac{\partial u_q}{\partial \alpha_s} = L_q^T \frac{\partial U}{\partial \alpha_s} = L_q^T \sum_{i=1}^{n} \frac{\partial U_i}{\partial \alpha_s} = L_q^T \cdot [u_s^x, u_s^y] \cdot [-f_s\sin\alpha_s, f_s\cos\alpha_s]^T; \qquad \text{Eq. 4}$$

step 5.1.4) solving, by utilizing results of Eq.3 and Eq.4, a worst working condition $\tilde{I}_q$ by a gradient search algorithm, and an external load of the worst working condition being $F=\tilde{F}_q$;

step 5.2) restoring $\mu_X$ to X under the worst working condition $\tilde{I}_q$, so that constraint performance $\tilde{u}_q=u_q(\rho, X,\tilde{I}_q)$ under the worst working condition is only manifested as a probabilistic type, and solving a performance fluctuation under the worst working condition to evaluate reliability, comprising:

step 5.2.1) calculating, according to Eq.5, a gradient of the constraint performance $\tilde{u}_q$ with respect to a bounded probabilistic uncertainty parameter $X_i$(i=1 2, ..., m) under the worst working condition:

$$\frac{\partial \tilde{u}_q}{\partial X_i} = L_q^T \frac{\partial \tilde{U}}{\partial X_i} = -L_q^T K^{-1} \frac{\partial K}{\partial X_i} \tilde{U} = -L_q^T K^{-1} \left( \sum_{e=1}^{N_e} \rho_e^p \frac{\partial k_e}{\partial X_i} \right) \tilde{U} \qquad \text{Eq. 5}$$

where a summation symbol is a combination operation of the element stiffness matrix defined by a finite element theory, $k_e$ is an element stiffness matrix, a nodal displacement vector $\tilde{U}$ under the worst working condition is obtained by solving a governing equation $K\tilde{U}=\tilde{F}_q$ under the worst working condition; and p is a penalty factor;

step 5.2.2) searching, based on a result of Eq.5, two bounded probabilistic uncertainty vectors minimizing or maximizing $u_q$ $(\rho,X,\tilde{I}_q)$ respectively according to Eq.6:

$$\begin{cases} X_q^L = \underset{X}{\mathrm{argmin}}\, u_q(\rho, X, \tilde{I}_q) \\ X_q^R = \underset{X}{\mathrm{argmax}}\, u_q(\rho, X, \tilde{I}_q) \end{cases} (q = 1, 2, \ldots, N_{con}) \quad \text{Eq. 6}$$

where corresponding to $X_q^L$ and $X_q^R$, global stiffness matrix K is $K_q^L$ and $K_q^R$, respectively, $K_q^L$ is denoted as $K_q^L=K(\rho,X_q^L)$ and $K_q^R$ is denoted as $K_q^R=K(\rho,X_q^R)$, $K_q^L$ and $K_q^R$ are uniformly marked as $K_q^*$ (*=L,R), the nodal displacement vector $\tilde{U}$ is $\tilde{U}_q^L$ and $\tilde{U}_q^R$, respectively, and $\tilde{U}_q^L$ and $\tilde{U}_q^R$ are uniformly marked as $\tilde{U}_q^*$ (*=L,R); and step 5.2.3) denoting $\tilde{u}_q^L=u_q(\rho, X_q^L, \tilde{I}_q)$ and $\tilde{u}_q^R=u_q(\rho, X_q^R, \tilde{I}_q)$, defining $[\tilde{u}_q^L, \tilde{u}_q^R]$ as a performance fluctuation of the constraint performance $u_q$ under the worst working condition, and calculating a reliability $\tilde{R}_q$ of the constraint performance according to Eq.7:

$$\tilde{R}_q = \frac{1}{2}\tanh\{P\cdot(u_{qcri}-u_q^C)\cdot[1+(P\cdot(u_{qcri}-u_q^C))^\gamma]\} + \frac{1}{2} \quad \text{Eq. 7}$$

where $u_q^C=(\tilde{u}_q^R+\tilde{u}_q^L)/2$ is a midpoint of the performance fluctuation under the worst working condition; P is a multiplier calculated by $P=1(u_q^W-\varepsilon^u)$, where $\varepsilon^u$ is a small constant for adjusting reliability at a boundary position of the performance fluctuation under the worst working condition; $u_q^W=(\tilde{u}_q^R-\tilde{u}_q^L)/2$ is a radius of the performance fluctuation under the worst working condition; and $\gamma \in \{2i|i\in N^+\}$ is a regulatory factor; and establishing the constraint functions in Eq.1 as Eq.8:

$$g_q(\rho,X,I)=-\tilde{R}_q+P_q\leq 0 (q=1, 2, \ldots, N_{con}) \quad \text{Eq.8}$$

step 6) calculating gradients of objective and constraint functions with respect to the design variables:

step 6.1) calculating the gradient of the objective function through Eq.9:

$$\frac{\partial V(\rho)}{\partial \rho_e} = \frac{1}{V_0} (e=1, 2, \ldots, N_e) \quad \text{Eq. 9}$$

step 6.2) solving the gradient of a constraint function as follows:

step 6.2.1) writing a gradient expression of $g_q(\rho,X,I)$ according to a chain rule, as shown in Eq.10:

$$\frac{\partial g_q(\rho, X, I)}{\partial \rho_e} = \quad \text{Eq. 10}$$

-continued $$\frac{\partial g_q(\rho, X, I)}{\partial \tilde{u}_q^L}\frac{\partial \tilde{u}_q^L}{\partial \rho_e} + \frac{\partial g_q(\rho, X, I)}{\partial \tilde{u}_q^R}\frac{\partial \tilde{u}_q^R}{\partial \rho_e} (e=1, 2, \ldots, N_e)$$

step 6.2.2) denoting a function in a bracket of tanh(•) in Eq.7 as $R(u_{qcri})$, and calculating gradient terms $\partial g_q(\rho,X,I)/\partial \tilde{u}_q^L$ and $\partial g_q(\rho,X,I)/\partial \tilde{u}_q^R$ in Eq.10 according to Eq.11:

$$\frac{\partial g_q(\rho, X, I)}{\partial \tilde{u}_q} = \frac{\mathrm{sech}^2(R(u_{qcri}))}{2}\cdot\frac{\partial R(u_{qcri})}{\partial \tilde{u}_q^*}(*=L,R) \quad \text{Eq. 11}$$

where a gradient term $\partial R(u_{qcri})/\partial \tilde{u}_q^*$ is as follows:

$$\frac{\partial R(u_{qcri})}{\partial \tilde{u}_q^L} = \frac{u_{qcri}-u_q^C}{2P^2}-\frac{P}{2}+\frac{(u_{qcri}-u_q^C)^{\gamma+1}}{2P^2}-\frac{P(\gamma+1)}{2}(u_{qcri}-u_q^C)^\gamma \quad \text{Eq. 12}$$

$$\frac{\partial R(u_{qcri})}{\partial \tilde{u}_q^R} = \quad \text{Eq. 13}$$

$$-\frac{u_{qcri}-u_q^C}{2P^2}-\frac{P}{2}-\frac{(u_{qcri}-u_q^C)^{\gamma+1}}{2P^2}-\frac{P(\gamma+1)}{2}(u_{qcri}-u_q^C)^\gamma$$

step 6.2.3) giving gradient terms $\partial \tilde{u}_q^L/\partial \rho_e$ in Eq.10 in a uniform form according to the SIMP framework:

$$\frac{\partial \tilde{u}_q^*}{\partial \rho_e} = -L_q^T(K_q^*)^{-1}\frac{\partial K_q^*}{\partial \rho_e}\tilde{U}_q^* (*=L,R) \quad \text{Eq. 14}$$

where $K_q^*$ and $\tilde{U}_q^*$ (*=L,P) are defined in 5.2.2; and a gradient term $\partial K_q^*/\partial \rho_e$ is calculated according to Eq.15:

$$\frac{\partial K_q^*}{\partial \rho_e} = p\rho_e^{p-1}\langle k_{eq}^*\rangle (*=L,R) \quad \text{Eq. 15}$$

where $k_{eq}^*$ is an element stiffness matrix extracted from $K_q^*$, and $\langle k_{eq}^*\rangle$ is a square matrix reconstructed by performing a combined operation on elements in $k_{eq}^*$ according to the element stiffness matrix, and is consistent with $K_q^*$ in dimensionality; and step 6.2.4) substituting all the gradient terms in Eq.11 to Eq.15 into Eq.10 to obtain a gradient of the constraint function $g_q(\rho,X,I)$; and step 7) updating the design variables by using a moving asymptote algorithm based on the gradients of the objective and constraint functions with respect to the design variables, checking a difference value between an objective function value in a current iteration and an objective function value in a previous iteration, wherein the difference value for a first iteration is defined as an objective function value, and when the difference value is less than a convergence threshold, outputting the updated design variables, or otherwise, repeating the steps 5) to 7).

* * * * *